United States Patent
Han et al.

(10) Patent No.: US 11,616,100 B2
(45) Date of Patent: Mar. 28, 2023

(54) DISPLAY PANEL, FABRICATING METHOD THEREOF, AND DISPLAY APPARATUS

(71) Applicant: BOE TECHNOLOGY GROUP CO., LTD., Beijing (CN)

(72) Inventors: Ying Han, Beijing (CN); Jianye Zhang, Beijing (CN); Wei Li, Beijing (CN); Wei Liu, Beijing (CN); Xing Zhang, Beijing (CN); Ning Li, Beijing (CN); Jiangbo Chen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 344 days.

(21) Appl. No.: 16/754,810

(22) PCT Filed: May 24, 2019

(86) PCT No.: PCT/CN2019/088365
§ 371 (c)(1),
(2) Date: Apr. 9, 2020

(87) PCT Pub. No.: WO2020/237430
PCT Pub. Date: Dec. 3, 2020

(65) Prior Publication Data
US 2021/0408132 A1 Dec. 30, 2021

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 51/5262* (2013.01); *H01L 51/56* (2013.01)

(58) Field of Classification Search
None
See application file for complete search history.

(56) References Cited

U.S. PATENT DOCUMENTS

| 7,002,725 B2 | 2/2006 | Huang et al. |
| 7,573,193 B2 | 8/2009 | Okutani et al. |
| 7,619,357 B2 | 11/2009 | Onishi et al. |

(Continued)

FOREIGN PATENT DOCUMENTS

| CN | 1575075 A | 2/2005 |
| CN | 1806270 A | 7/2006 |

(Continued)

OTHER PUBLICATIONS

Office Action dated Jun. 23, 2021, issued in counterpart CN Application No. 201980000727.0, with English Translation. (16 pages).

(Continued)

*Primary Examiner* — Michelle Mandala
(74) *Attorney, Agent, or Firm* — WHDA, LLP (57) ABSTRACT

A display panel includes a thin film transistor layer (4), a grating layer (3), a transparent anode layer (2), an emission layer (1), and a colored layer (6) opposite the emission layer (1). The colored layer (6) may include a plurality of color filters. The grating layer (3) may be between the thin film transistor layer (4) and the transparent anode layer (2). The grating layer (3) may include a plurality of blazed gratings corresponding to the plurality of color filters, respectively.

19 Claims, 9 Drawing Sheets

(56) References Cited

U.S. PATENT DOCUMENTS

| | | | |
|---|---|---|---|
| 10,459,282 B2 | 10/2019 | Wang et al. | |
| 2006/0071233 A1* | 4/2006 | Cho | H01L 51/5275 257/103 |
| 2018/0080885 A1 | 3/2018 | Ginsberg et al. | |

FOREIGN PATENT DOCUMENTS

| | | |
|---|---|---|
| CN | 102707368 A | 10/2012 |
| CN | 105700212 A | 6/2016 |
| CN | 107039492 A | 8/2017 |
| CN | 107836041 A | 3/2018 |
| CN | 109031757 A | 12/2018 |
| CN | 109768068 A | 5/2019 |
| JP | 2005258032 A | 9/2005 |
| TW | 200419190 A | 10/2004 |

OTHER PUBLICATIONS

International Search Report dated Feb. 11, 2020, issued in counterpart Application No. PCT/CN2019/088365 (11 pages).

* cited by examiner

Related Art

DISPLAY PANEL, FABRICATING METHOD THEREOF, AND DISPLAY APPARATUS

TECHNICAL FIELD

This disclosure relates to display technology, more particularly, to a display panel and a fabricating method thereof, and a display apparatus.

BACKGROUND

With development of display technology, richness of display color of a display apparatus has gained more and more attention. It is desirable that the display apparatus can display a large gamut of colors as well as reproduce original color of nature, thereby making viewing effect more lively and natural.

However, due to limitation of color filter material and emission layer (EL) spectrum, the display color gamut is limited. In particular, the current blue-light bandwidth is not narrow enough, and the blue pixel has the greatest influence on the final color gamut.

A white organic light-emitting diode with color filters (WOLED+CF) is a structure often used in large-size OLED technology. This structure has the advantages of high utilization rate of organic EL material, low mask requirement for vapor deposition of EL, and improved aperture ratio by top emission EL. However, the WOLED+CF structure can display a limited color gamut, and has the problem of low display color gamut.

BRIEF SUMMARY

New structural design of the display panels according to some embodiments of the present disclosure utilizes a grating layer including a plurality of blazed gratings to purify emission wavelengths of corresponding pixels such as B, G, and R pixels, thereby improving the color gamut of the display panel. One embodiment of the present disclosure provides a display panel. The display panel may include a thin film transistor layer, a grating layer, a transparent anode layer, an emission layer, and a colored layer opposite the emission layer. The colored layer includes a plurality of color filters. The grating layer is between the thin film transistor layer and the transparent anode layer. The grating layer includes a plurality of blazed gratings corresponding to the plurality of color filters, respectively.

Another example of the present disclosure provides a method of forming a display panel. The method may include forming a thin film transistor layer, forming a grating layer on the thin film transistor layer, forming an anode layer on the grating layer, forming an emission layer on the anode layer, and forming a colored layer opposite the emission layer. The grating layer may include a plurality of blazed gratings corresponding to the plurality of color filters, respectively.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-9. When referring to the figures, like structures and elements shown throughout are indicated with like reference numerals.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covers", "on", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

In addition, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

A numerical range modified by "about" herein means that the upper and lower limits of the numerical range can vary by 10% thereof.

Figure 1:
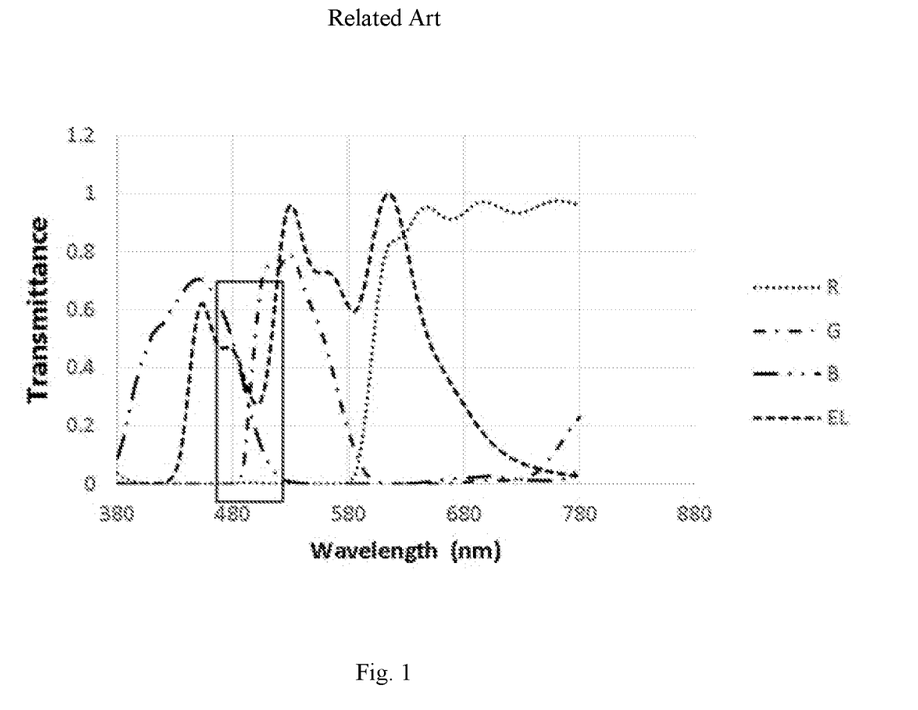
FIG. 1 shows transmittance of white light passing through a display panel in the related art.

A main limitation of the display color gamut in the conventional design of the WOLED display panel is that individual light spectrum is too wide and not sufficiently purified. For example, FIG. 1 shows transmittance of white light passing through a WOLED display panel in related art. The color filters include a blue color filter, a green color filter, and a red color filter. In FIG. 1, EL represents the spectrum of white light emitted by the pixel light-emitting layer, and R, G, and B represents the spectra of three pixel color filters of red, green, and blue respectively. According to the EL spectrum of the WOLED display panel as shown in FIG. 1, the peak wavelengths, the wavelengths having the highest energy, of the B color light, the G color light, and the R color light are 450 nm, 530 nm, 615 nm, respectively. That is, the R,G,B color light central wavelengths are determined.

Furthermore, as shown in FIG. 1, for the portion of the EL spectrum in the middle of the G and B peaks (about 500 nm or so, enclosed in a line box), the color filter has relatively high transmittance in this area after the white light passes through the color filter. For example, the light of about a wavelength of 480 nm passes through the B color filter, the transmittance of the blue color filter still has a transmittance of about 0.45. Thus, the color filter does not have a significant filtering effect on this area of the light. As shown in FIG. 1, the bandwidth of the B color light is wider. At the area enclosed in the lined box between the peak wavelengths of B and G color lights, some of G color light is mixed into the B color light. In other words, the blue color spectrum was not effectively filtered by the blue color filter, thereby resulting in a wider B-bandwidth and a light color, which affects negatively final display color gamut. Eventually, the B color light is not sufficiently purified. Similar phenomena can be observed with regard to the G color light and the R color light, both of which are not sufficiently purified.

In some embodiments of the present disclosure, by utilizing a special grating layer including a plurality of blazed gratings corresponding to the plurality of color filters respectively, the new structural design of the display panel can purify emission wavelengths of a plurality of pixels such as B, G, and R pixels, thereby improving the color gamut.

Figure 2:
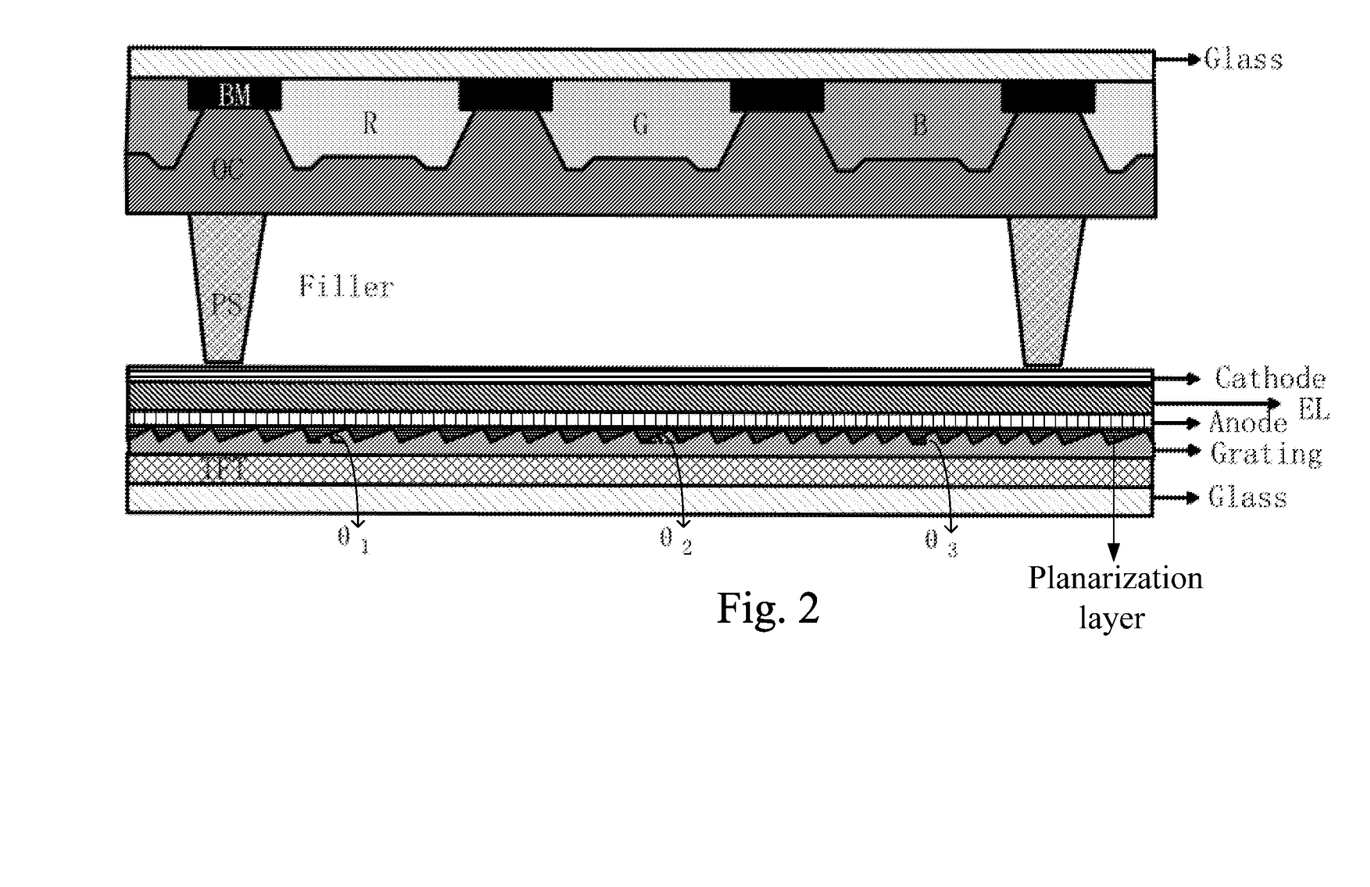
FIG. 2 shows a schematic structure of a display panel according to one embodiment of the present disclosure.

Accordingly, FIG. 2 shows a schematic structure of a display panel according to one embodiment of the present disclosure. As shown in FIG. 2, the display panel may include a thin film transistor (TFT) layer, a grating layer on the TFT layer, a transparent anode layer on the grating layer, an emission layer on the anode layer, a cathode layer on the emission layer, and a colored layer opposite the cathode layer. The colored layer includes a plurality of color filters. The grating layer is between the thin film transistor layer and the transparent anode layer. The grating layer includes a plurality of blazed gratings corresponding to the plurality of color filters, respectively.

In one embodiment, the emission layer may include at least one selected from the group consisting of an electron transport layer, an electron injection layer, a light emitting layer, a hole transport layer, and a hole injection layer on a side of the anode layer opposite from the grating layer. Furthermore, as shown in FIG. 2, the display panel may further include photo supports (PS) and fillers between the cathode layer and the colored layer. A glass substrate may be formed on a side of the TFT layer opposite from the grating layer. A black matric (BM) is formed between the plurality of color filters. An optically clear (OC) layer is formed on a side of the colored layer facing the cathode layer.

Figure 3:
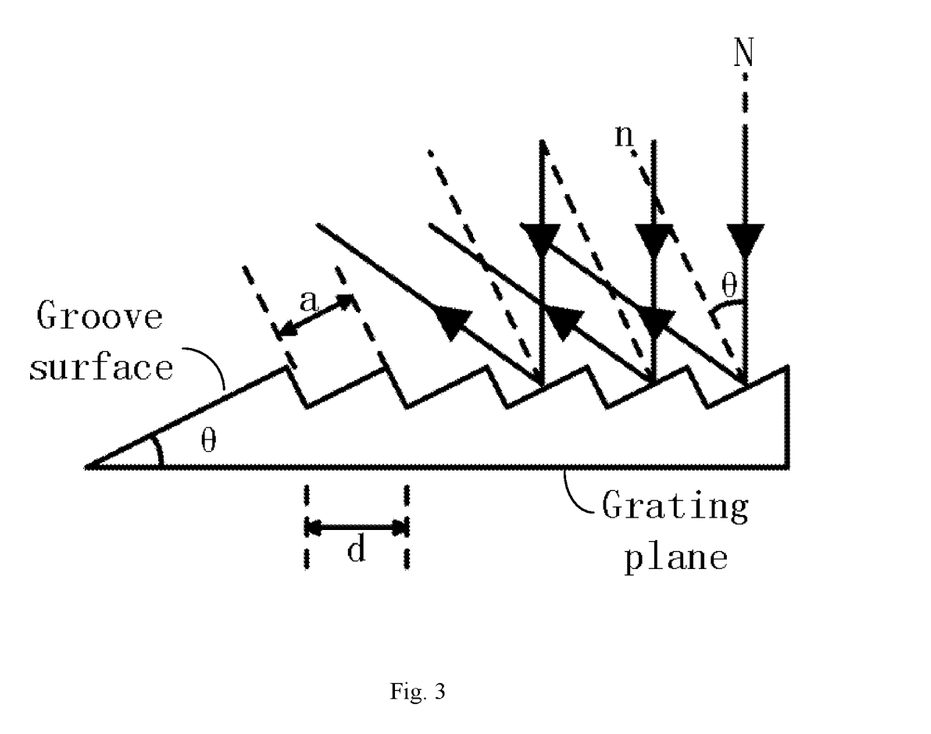
FIG. 3 shows a schematic blazed grating according to one embodiment of the present disclosure.

FIG. 3 shows a schematic diagram of a blazed grating according to one embodiment of the present disclosure. The blazed grating may include a grating base and a plurality of grating steps on the grating base. Each of the plurality of grating steps may have a triangular cross-section in a plane perpendicular to the grating base. Each grating step includes two exposed facets which form two sides of the triangular cross-section. As shown in FIG. 3, one of the two exposed facets is a groove surface which has a length indicated by a and a normal direction indicated by n.

The blazed grating is a specific form of diffraction grating designed to produce the maximum grating efficiency in a specific diffraction order. This means that the majority of the optical power may be in a designed diffraction order while minimizing power lost to other orders (particularly the zero-th order). Due to this design, a blazed grating operates at a specific wavelength, known as the blaze wavelength. The blazed grating has great advantage compared with other types of transmission gratings. For example, a blazed grating can concentrate light energy to a specific order of secondary spectrum and a central wavelength of the specific order of the secondary spectrum can be controlled by controlling blaze angle and grating period of the blazed grating.

In one embodiment, as shown in FIG. 3, when a light is incident along the normal direction N of the grating plane or grating base, the following grating formula is satisfied:

$$d \sin 2\theta = \lambda_1$$

wherein $\lambda_1$ is the first-order blaze wavelength, $\theta$ is the blaze angle, d is the grating period, which is a distance between valleys or peaks of two adjacent grating steps. 80 to 90% of the light energy may be concentrated on the first-order line, so that its intensity is high. Thus, most of the light energy can be concentrated to a certain wavelength $\lambda_1$ by controlling design of the blaze angle $\theta$ and grating period d according to the grating equation. Furthermore, according to the grating formula, since the diffraction angle $\sin 2\theta$ cannot be greater than 1, there is a limit regarding the maximum wavelength of the first order diffracted light $\lambda_1$. At the same time, the blazed direction of $\lambda_1$ is unlikely to be the blazed direction of other wavelengths, so light intensity of other wavelengths in the first-order line will be weak.

The grating steps may be made of a transparent material. In one embodiment, the transparent material is $SiO_x$. The grating base may be made of metal Al or metal Ag. There may be an intermediate portion between the grating base and the plurality of grating steps, and the intermediate portion may be made of the same material as the grating steps.

In one embodiment, the display panel may further include a planarization layer between the grating layer and the transparent anode layer.

The positional relationship between the color filters and the blazed gratings and characteristics of the blazed gratings such as blaze angles and grating periods will be discussed in detail for illustration purpose with reference to FIGS. 4-6.

Figure 4:
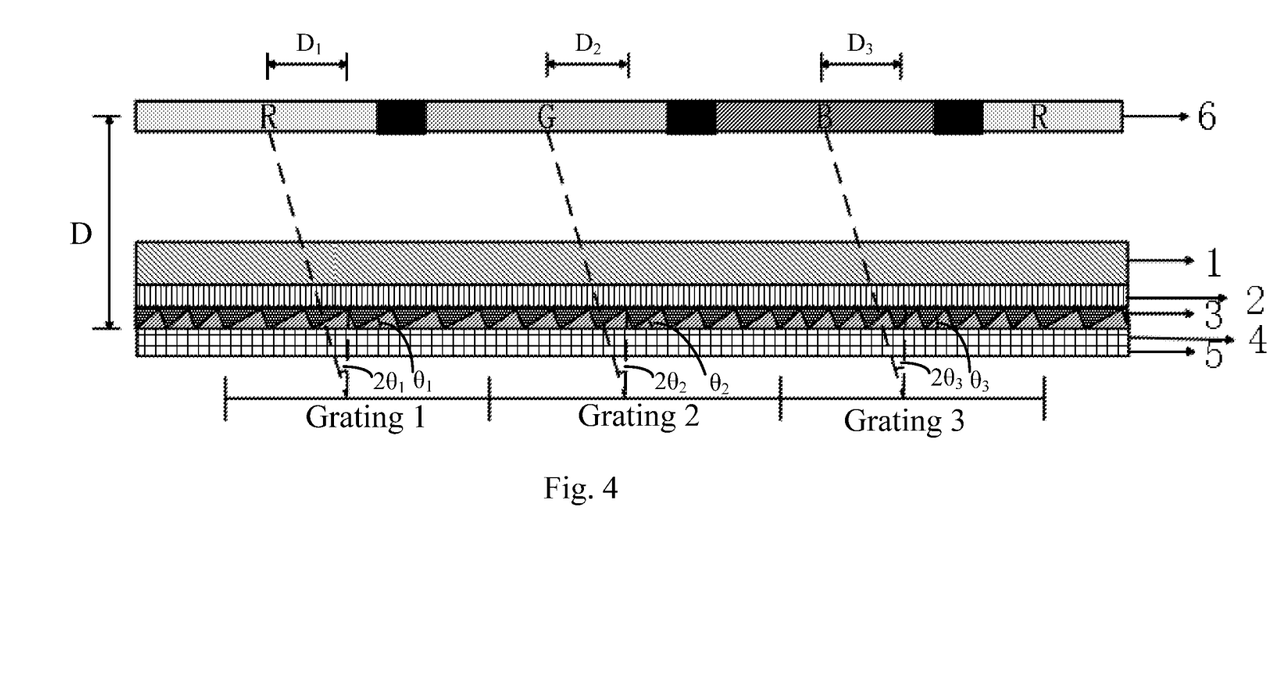
FIG. 4 shows a schematic structure of a display panel according to one embodiment of the present disclosure.
Figure 5:
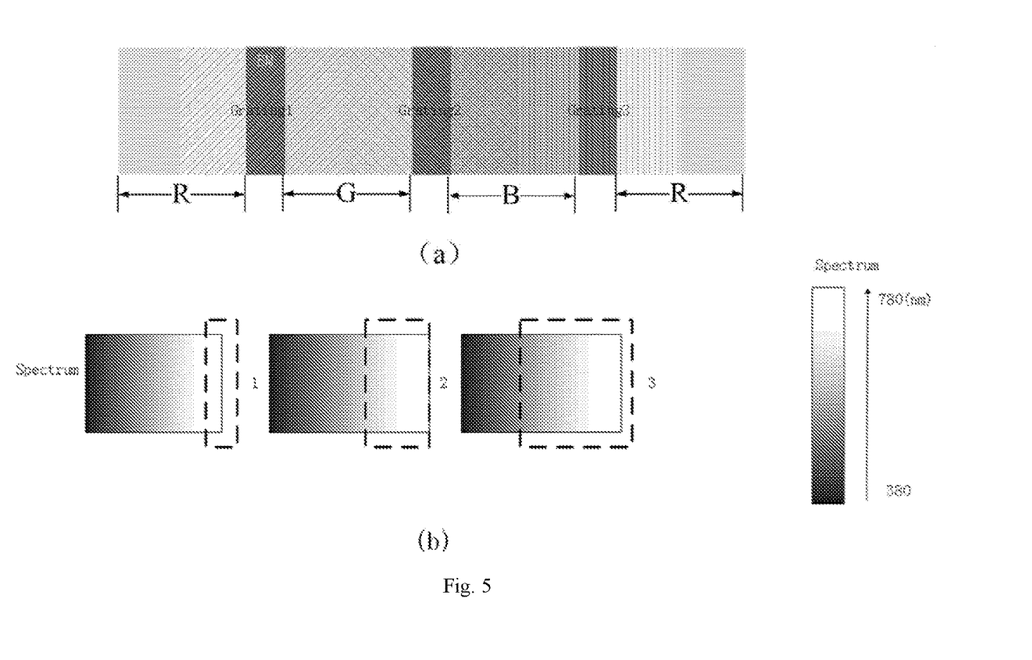
FIG. 5(a) shows orthographic projection of the blazed gratings on the colored layer according to one embodiment of the present disclosure.
FIG. 5(b) shows spectrum of first order of diffracted light after white light is incident on a grating layer according to one embodiment of the present application.

FIG. 4 shows schematic diagram of a display panel according to one embodiment of the present disclosure. As shown in FIG. 4, the display panel may include a glass layer 5, a thin film transistor (TFT) layer 4, a grating layer 3 on the TFT layer 4, a transparent anode layer 2 on the grating layer 3, an emission layer 1 on the anode layer, and a colored layer 6 opposite the emission layer 1. The emission layer 1 may include a cathode layer. The colored layer includes a plurality of color filters. The plurality of color filters includes a red (R) color filter, a green (G) color filter, and a blue (B) color filter. The plurality of blazed gratings comprises a blazed grating 1 corresponding to the red color filter, a blazed grating 2 corresponding to the green color filter, and a blazed grating 3 correspond to the blue color filter. A planarization layer is disposed between the grating layer and the transparent anode layer.

FIG. 5(a) shows orthographic projection of blazed gratings 1, 2, and 3 on the colored layer according to one embodiment of the present disclosure. The positional relationship of the color filters and the corresponding blazed gratings may be configured so that the first order of diffracted light from the blazed gratings will mostly fall on the corresponding color filters respectively.

In one embodiment, the blazed grating 1 corresponding to the R color filter may have a grating period $d_1$ and a blaze angle $\theta_1$. The positional relationship of the R color filter and the blazed grating 1 may be configured to ensure that the first-order diffracted light by the blazed grating 1 will mostly fall on the R color filter. In one embodiment, as shown in FIG. 4, a line between a center of the R color filter and a center of the blazed grating 1 corresponding to the R color filter forms an angle of about $2\theta_1$ with respect to a normal line of the grating base. That is, a lateral distance between the center of the R color filter and the center of the blazed grating 1 is D1, and $D_1 = D \tan 2\theta_1$, wherein D is the distance from the grating base to the colored layer. When white light emitted by the EL is incident on the blazed grating 1 along the normal line N of the grating plane, the first-order diffracted light by the blazed grating 1 forms an angle of $2\theta_1$ with respect to the normal line N of the grating base. As such, the first-order diffracted light by the blazed grating 1 will mostly fall on the R color filter.

Similarly, in one embodiment, the blazed grating 2 corresponding to the G color filter has a grating period $d_2$ and a blaze angle $\theta_2$. The positional relationship of the G color filter and the blazed grating 2 may be configured to ensure that the first-order diffracted light by the blazed grating 2 will mostly fall on the G color filter. In one embodiment, as shown in FIG. 4, a line between a center of the G color filter and a center of the blazed grating 2 corresponding to the G color filter forms an angle of about $2\theta_2$ with respect to a normal line of the grating base. That is, a lateral distance between the center of the G color filter and the center of the blazed grating 2 is $D_2$, and $D_2 = D \tan 2\theta_2$, wherein D is the distance from the grating plane to the colored layer. When the white light emitted by the EL is incident on the blazed grating 2 along the normal line N of the grating plane, the first-order diffracted light by the blazed grating 2 forms an angle of $2\theta_2$ with respect to the normal line N of the grating base. As such, the first-order diffracted light by the blazed grating 2 will mostly fall on the G color filter.

Similarly, in one embodiment, the blazed grating 3 corresponding to the B color filter may have a grating period $d_3$ and a blaze angle $\theta_3$. The positional relationship of the B color filter and the blazed grating 3 may be configured to ensure that the first-order diffracted light by the blazed grating 3 will mostly fall on the B color filter. In one embodiment, as shown in FIG. 4, a line between a center of the B color filter and a center of the blazed grating 3 corresponding to the B color filter forms an angle of about $2\theta_3$ with respect to a normal line of the grating base. That is, the lateral distance between the center of the B color filter and the center of the blazed grating 3 is $D_3$, and $D_3 = D \tan 2\theta_3$, wherein D is the distance from the grating base to the colored layer. When the white light emitted by the EL is incident on the blazed grating 3 along the normal line N of the grating base, the first-order diffracted light by the blazed grating 3 forms an angle of $2\theta_3$ with respect to the normal line N of the grating base. As such, the first-order diffracted light by the blazed grating 3 will mostly fall on the B color filter.

FIG. 5(b) shows diffraction spectra of white light by bladed gratings 1, 2, and 3 respectively. A grating is analogous to a lens. When a beam of white light is incident on a grating, each wavelength of input beam spectrum is sent into a different direction, thereby producing a rainbow of colors in the first order of diffracted light.

In one embodiment, the grating period $d_1$ of blazed grating 1 may be configured so that when white light emitted by the emission layer is vertically incident on the blazed grating 1 corresponding to the R color filter, light of $\lambda > 0.65$ μm cannot be diffracted out of the blazed grating 1 according to grating formula. That is, as shown in FIG. 5(b), the spectrum enclosed in the dash lined box 1 is not diffracted out of the blazed grating 1. In one embodiment, the grating period $d_1$ is not more than about 0.65 μm.

Similarly, in one embodiment, the grating period $d_2$ of the blazed grating 2 may be configured so that when white light emitted by the emission layer is vertically incident on the blazed grating 2 corresponding to the G color filter, light of $\lambda > 0.56$ μm cannot be diffracted out of the blazed grating 2 according to grating formula. That is, as shown in FIG. 5(b), the spectrum enclosed in the dashed lined box 2 is not diffracted out of the blazed grating 2. In one embodiment, the grating period $d_2$ of the blazed grating 2 is not more than about 0.6 μm, preferably not more than about 0.56 μm.

Similarly, in one embodiment, the grating period $d_3$ of the blazed grating 3 may be configured so that when white light emitted by the emission layer is vertically incident on the blazed grating 3 corresponding to the B color filter, light of $\lambda > 0.48$ μm cannot be diffracted out of the blazed grating 3 according to grating formula. That is, as shown in FIG. 5(b), the spectrum enclosed in the dash lined box 3 is not diffracted out of the blazed grating 3. In one embodiment, the grating period $d_3$ is not more than about 0.5 μm, preferably not more than about 0.48 μm.

Figure 6:
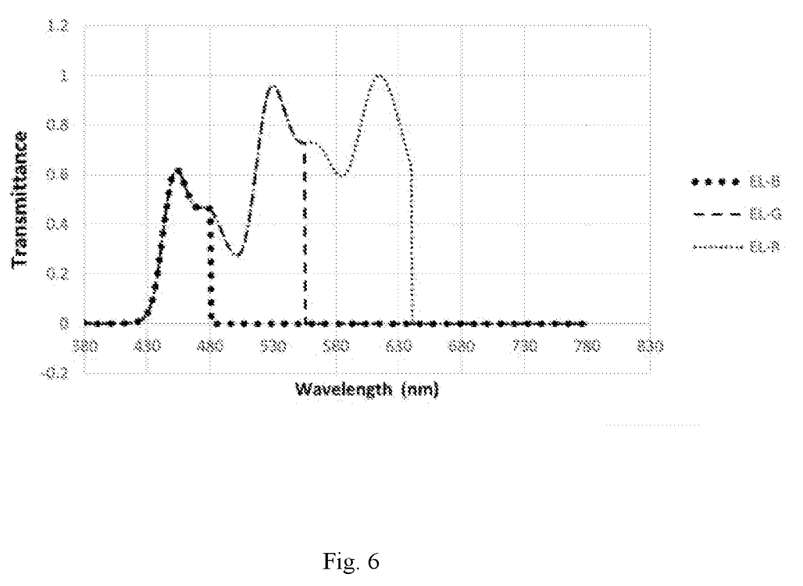
FIG. 6 shows transmittance of white light passing through a display panel according to one embodiment of the present application.

FIG. 6 shows transmittance of white light from the EL exiting a display panel according to one embodiment of the present disclosure. The color filters include the B color filter, the G color filter, and the R color filter. Since the three R, G, B color filters correspond to the blazed gratings of different periods and blaze angles respectively, the EL spectrum exiting the color filters is as follows: EL-R, EL-G, EL-B, respectively. As shown in FIG. 6, the wavelength of the diffracted light can be controlled by controlling the grating period d of each blazed grating. In one embodiment, $d_1 = 0.65$ um, and the light having a wavelength greater than 0.65 um is filtered out by the blazed grating 1. That is, as shown in EL-R of FIG. 6, the transmittance of light of greater than 0.65 um is 0. Accordingly, the full width and/or half width of the R-light spectrum become smaller. Similarly, in one embodiment, $d_2$=0.56 um, and the light having a wavelength greater than 0.56 um is filtered out by the blazed grating 2. That is, as shown in EL-G of FIG. 6, the transmittance of light of greater than 0.56 um is 0. Accordingly, the full width and/or half width of the G-light spectrum become smaller. Similarly, in one embodiment, $d_3$=0.48 um, and the light having a wavelength greater than 0.48 um is filtered out by the blazed grating 3. That is, as shown in EL-B of FIG. 6, the transmittance of light of greater than 0.48 um is 0. Accordingly, the full width and/or half width of the B-light spectrum become smaller. In this case, since the light of λ>0.48 um cannot be diffracted out of the blazed grating 3, there is no G color of light in the first order of diffracted spectrum from the blazed grating 3. That is, there is no G color light mixing into the B color light. Each color filter may correspond to a pixel. As a result, the exiting light of the R, G, and B pixels is purified. Thus, by designing appropriate d and θ, light of more than a certain wavelength in each pixel cannot be diffracted out so that the full width and/or half-width of spectrum of each pixel are reduced. That is, the spectrum of each pixel is purified, thereby improving the display color gamut.

In some embodiments of the present disclosure, a grating layer including a plurality of blazed gratings is utilized to purify light spectrum emitted from different pixels. That is, the grating layer is disposed between the TFT layer and the transparent anode layer. The plurality of blazed gratings corresponds to a plurality of different color filters respectively. Each pixel may include one color filter and one corresponding blazed grating, and characteristics of each blazed grating such as blaze angle and grating period can be adjusted individually. The positional relationship of the plurality of color filters and the plurality of corresponding blazed gratings can be configured to ensure that the first order of diffracted light from the blazed gratings falls mostly on the plurality of corresponding color filters respectively. Furthermore, the grating periods of the blazed gratings may be configured so that the light of more than a certain wavelength cannot be diffracted out of the corresponding blazed gratings. As a result, the full width and half-width of light spectrum of different pixels are reduced, and the spectrum is purified, thereby improving the color gamut.

Figure 8:
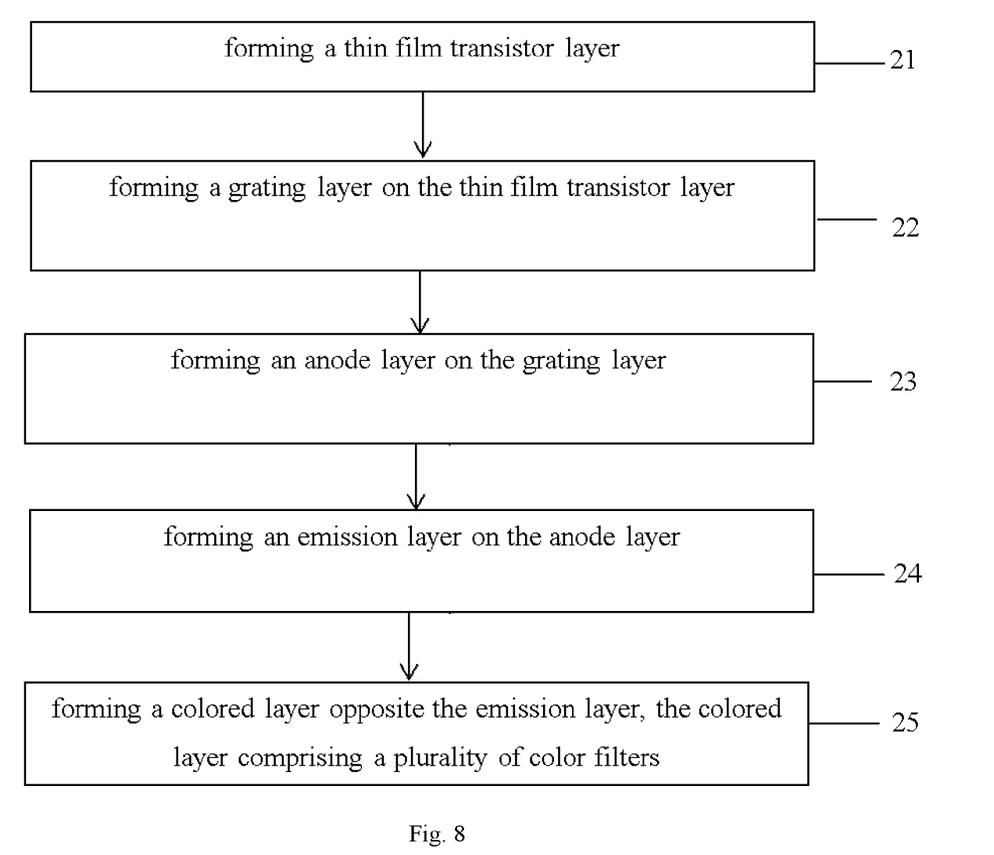
FIG. 8 shows a flowchart of a method of fabricating a display panel according to one embodiment of the present disclosure.

Another example of the present disclosure is a method of forming a display panel. As shown in FIG. 8, the method may include forming a thin film transistor layer (step 21), forming a grating layer on the thin film transistor layer (step 22), forming an anode layer on the grating layer (step 23), forming an emission layer on the anode layer (step 24), and forming a colored layer opposite the emission layer (step 25). The colored layer may include a plurality of color filters. The grating layer may include a plurality of blazed gratings corresponding to the plurality of color filters, respectively.

In one embodiment, forming the grating layer on the thin film transistor layer includes depositing a layer of grating base and forming a plurality of grating steps on the layer of the grating base. The plurality of blazed gratings corresponding to the plurality of color filters may have different grating periods and different blaze angles.

The plurality of blazed gratings may share one common grating base. The desired blaze wavelength for each blazed grating may be determined based on the EL spectrum, the color spectrum, and the final gamut requirement. Then, the grating period and the blaze angle for each blazed grating may be determined to ensure that light of more than a certain wavelength cannot be diffracted out in the first order of diffracted light of the blazed grating, and the first order of diffracted light from each blazed grating may fall mostly onto the corresponding color filter.

Figure 7A:
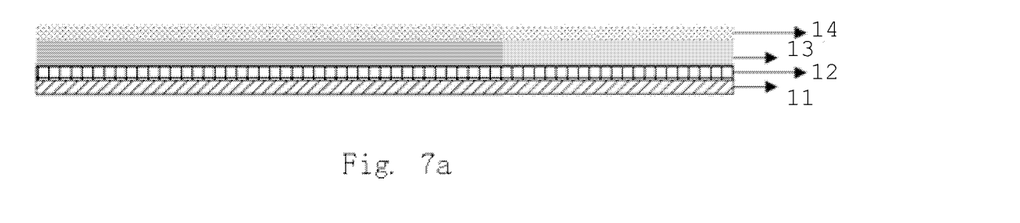
FIGS. 7a to 7f show schematic diagrams of a method of fabricating a grating layer according to one embodiment of present disclosure.
Figure 9:
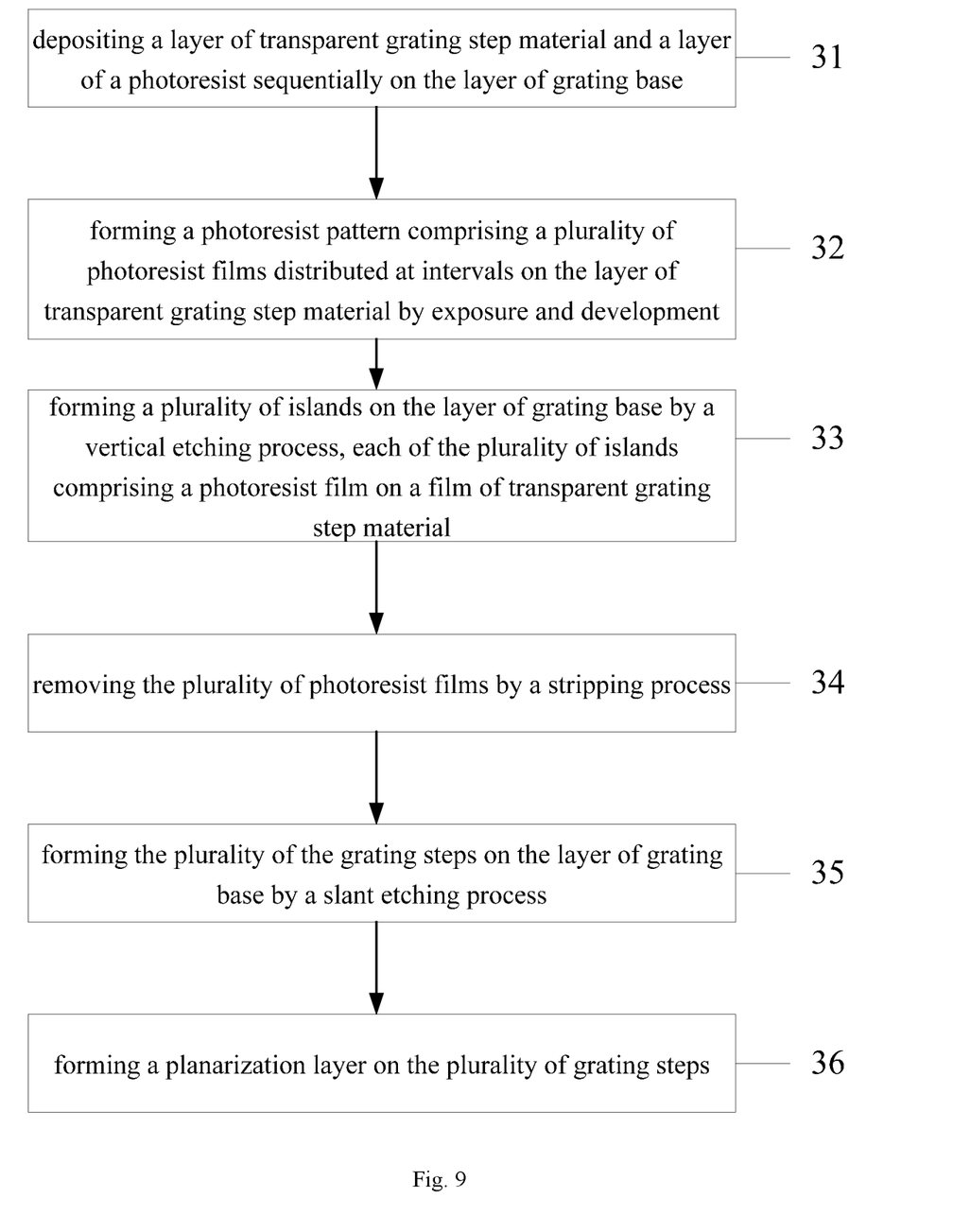
FIG. 9 shows a flowchart of a method of fabricating a grating layer according to one embodiment of the present disclosure.

FIGS. 7a to 7f show schematic illustrations of a method of forming a grating layer according to one embodiment of the present disclosure. The method of forming the grating layer may include steps 31 to 35, as shown in FIG. 9. As shown in FIG. 7a, step 31 of the method of forming the grating layer may include depositing a layer of transparent grating step material 13 such as $SiO_2$ material and a layer of a photoresist 14 sequentially on a layer of grating base 12. In one embodiment, a high reflectivity metal such as Al or Ag is deposited on the TFT layer as the layer of grating base. A layer of transparent material such $SiO_x$ is then deposited on the layer of grating base as the layer of grating step material by plasma-enhanced chemical vapor deposition (PECVD). The layer of grating base may be formed on a thin film transistor layer 11.

Figure 7B:
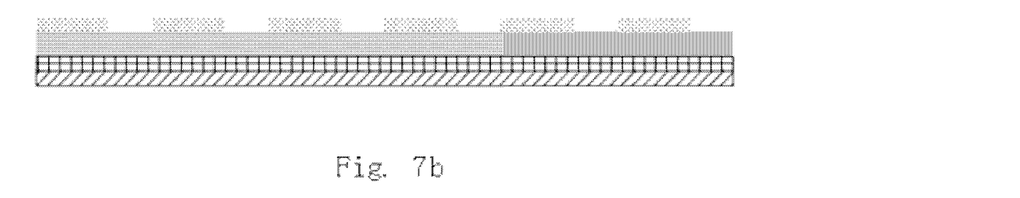

In one embodiment, as shown in FIG. 7b, step 32 of the method of forming the grating layer may include forming a photoresist pattern comprising a plurality of photoresist films distributed at intervals on the layer of transparent grating step material by exposure and development. The plurality of photoresist films will act as a mask during the subsequent vertical etching step. The sizes of the intervals between adjacent photoresist films may be different, depending on grating periods of corresponding blazed gratings subsequently formed.

Figure 7C:
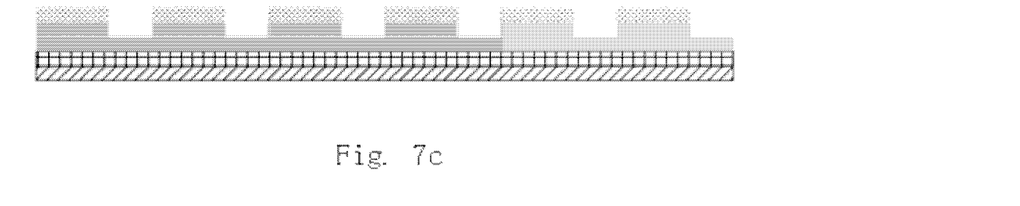

In one embodiment, as shown in FIG. 7c, after the plurality of photoresist films is formed, step 33 of the method of forming the grating layer may include forming a plurality of islands on the layer of grating base by a vertical etching process. Each of the plurality of islands comprises a stack of a photoresist film and a film of transparent grating step material.

Figure 7D:
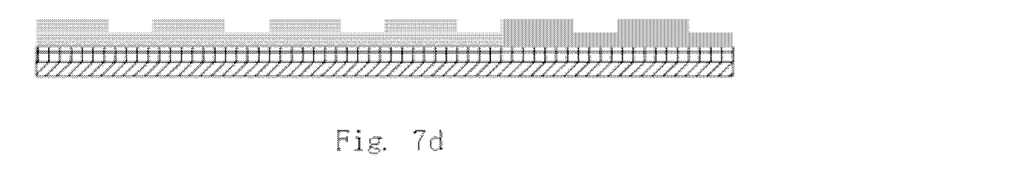

In one embodiment, as shown in FIG. 7d, step 34 of the method of forming the grating layer may include removing the plurality of photoresist films by a striping process. After the stripping process, the plurality of films of the transparent grating step material remains on the layer of grating base.

Figure 7E:
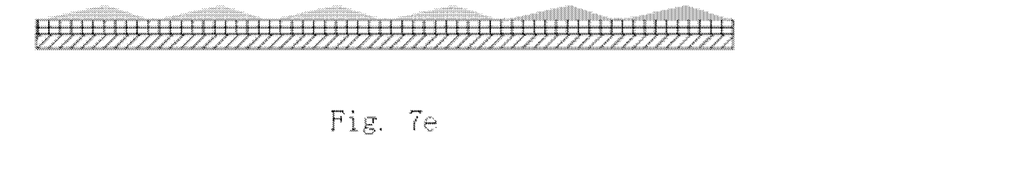

In one embodiment, as shown in FIG. 7e, step 35 of the method of forming the grating layer may include forming the plurality of grating steps on the layer of grating base by a slant etching process. The slant etching process can be controlled to form different blaze angle and grating period for each blazed grating. In one embodiment, the slant etching process uses a dry etching technique.

Figure 7F:
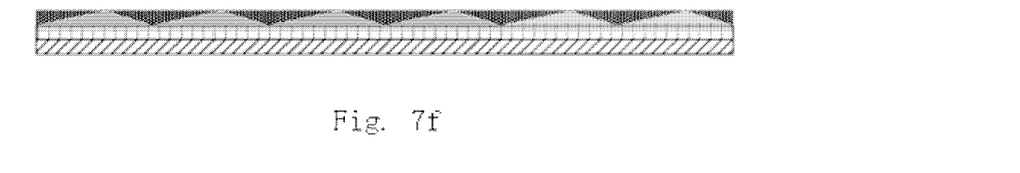

In one embodiment, as shown in FIG. 7f, step 36 of the method of forming the grating layer may include forming a planarization layer on the grating layer. The planarization layer may comprise materials having a small refractive index. In one embodiment, the planarization layer may be made of nanosilver ink. The nanosilver ink has characteristics of good transparency and good electrical conductivity. Thus, the nanosilver ink can not only flatten the surface of the blazed gratings, but also ensure good conductive contact with the anode layer.

After the planarization layer is completed, a transparent anode layer, an emission layer, and a colored layer can be subsequently formed on the grating layer.

Another example of the present disclosure is a display apparatus. The display apparatus includes the display panel according to one embodiment of the present disclosure. The display apparatus may be a top emission WOLED apparatus.

The principle and the embodiment of the present disclosure are set forth in the specification. The description of the embodiments of the present disclosure is only used to help understand the method of the present disclosure and the core idea thereof. Meanwhile, for a person of ordinary skill in the art, the present disclosure relates to the scope of the disclosure, and the technical embodiment is not limited to the specific combination of the technical features, and also should covered other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:

1. A display panel, comprising:
    a thin film transistor layer;
    a grating layer;
    a transparent anode layer;
    an emission layer; and
    a colored layer opposite the emission layer, the colored layer comprising a plurality of color filters;
    wherein the grating layer is between the thin film transistor layer and the transparent anode layer and the grating layer comprises a plurality of blazed gratings corresponding to the plurality of color filters, respectively;
    the emission layer is disposed between the colored layer and the grating layer;
    each of the plurality of blazed gratings comprises a grating base and a plurality of grating steps on the grating base, and each of the plurality of grating steps has a triangular cross-section in a plane perpendicular to the grating base; and
    a blazed grating corresponding to a color filter has a grating period d and a blaze angle θ, and a line between a center of the color filter and a center of the blazed grating corresponding to the color filter forms an angle of about 2θ with respect to a normal line of the grating base.

2. The display panel of claim 1, wherein the plurality of color filters comprises a blue color filter, a green color filter, and a red color filter; and the plurality of blazed gratings comprises a blazed grating corresponding to the blue color filter, a blazed grating corresponding to the green color filter, and a blazed grating correspond to the red color filter.

3. The display panel of claim 2, wherein the blazed grating corresponding to the red color filter has a grating period $d_1$ and a blaze angle $\theta_1$, and a line between a center of the red color filter and a center of the blazed grating corresponding to the red color filter forms an angle of about $2\theta_1$ with respect to a normal line of the grating base.

4. The display panel of claim 3, wherein the grating period $d_1$ is configured so that when white light emitted by the emission layer is vertically incident on the blazed grating corresponding to the red color filter, light of $\lambda > 0.65$ μm cannot be diffracted out of the blazed grating corresponding to the red color filter.

5. The display panel of claim 3, wherein the grating period $d_1$ is not more than about 0.65 μm.

6. The display panel of claim 2, wherein the blazed grating corresponding to the green color filter has a grating period $d_2$ and a blaze angle $\theta_2$, and a line between a center of the green color filter and a center of the blazed grating corresponding to the green color filter forms an angle of about $2\theta_2$ with respect to a normal line of the grating base.

7. The display panel of claim 6, wherein the grating period $d_2$ is configured so that when white light emitted by the emission layer is vertically incident on the blazed grating corresponding to the green color filter, light of $\lambda > 0.56$ μm cannot be diffracted out of the blazed grating corresponding to the green color filter.

8. The display panel of claim 6, wherein the grating period $d_2$ is not more than about 0.56 μm.

9. The display panel of claim 2, wherein the blazed grating corresponding to the blue color filter has a grating period $d_3$ and a blaze angle $\theta_3$, and a line between a center of the blue color filter and a center of the blazed grating corresponding to the blue color filter forms an angle of about $2\theta_3$ with respect to a normal line of the grating base.

10. The display panel of claim 9, wherein the grating period $d_3$ is configured so that when white light emitted by the emission layer is vertically incident on the blazed grating corresponding to the blue color filter, light of $\lambda > 0.48$ μm cannot be diffracted out of the blazed grating corresponding to the blue color filter.

11. The display panel of claim 9, wherein the grating period $d_3$ is not more than about 0.48 μm.

12. The display panel of claim 1, wherein the grating steps are made of a transparent material.

13. The display panel of claim 12, wherein the transparent material is $SiO_x$.

14. The display panel of claim 1, wherein the grating base is made of metal Al or metal Ag.

15. The display panel of claim 1, further comprising a planarization layer between the grating layer and the transparent anode layer.

16. A display apparatus, comprising the display panel according to claim 1.

17. A method of forming a display panel, the method comprising:
    forming a thin film transistor layer;
    forming a grating layer on the thin film transistor layer;
    forming an anode layer on the grating layer;
    forming an emission layer on the anode layer; and
    forming a colored layer opposite the emission layer, the colored layer comprising a plurality of color filters;
    wherein the grating layer comprises a plurality of blazed gratings corresponding to the plurality of color filters, respectively; and
    a blazed grating corresponding to a color filter has a grating period d and a blaze angle θ, and a line between a center of the color filter and a center of the blazed grating corresponding to the color filter forms an angle of about 2θ with respect to a normal line of the grating base.

18. The method of forming the display panel of claim 17, wherein forming the grating layer on the thin film transistor layer comprises:
    depositing a layer of grating base; and
    forming a plurality of grating steps on the layer of grating base,
    wherein the plurality of blazed gratings corresponding to different color filters has different grating periods and different blaze angles.

19. The method of forming the display panel of claim 18, wherein forming the plurality of grating steps on the layer of grating base comprises:
    depositing a layer of transparent grating step material and a layer of a photoresist sequentially on the layer of grating base;

forming a photoresist pattern comprising a plurality of photoresist films distributed at intervals on the layer of transparent grating step material by exposure and development;

forming a plurality of islands on the layer of the grating base by a vertical etching process, each of the plurality of islands comprising a photoresist film stacked on a film of transparent grating step material;

removing the plurality of photoresist films by a stripping process; and forming the plurality of the grating steps on the layer of grating base by a slant etching process.

* * * * *